United States Patent
Imashiro et al.

(10) Patent No.: US 6,524,711 B2
(45) Date of Patent: Feb. 25, 2003

(54) THERMOSETTING RESIN COMPOSITION, AND RESIN-COVERED METAL FOIL, PREPREG AND FILM-SHAPED ADHESIVE ALL USING THE COMPOSITION

(75) Inventors: Yasuo Imashiro, Chiba (JP); Takahiko Ito, Chiba (JP); Hideshi Tomita, Chiba (JP); Norimasa Nakamura, Chiba (JP)

(73) Assignee: Nisshinbo Industries, Inc., Toyko (JP)

( * ) Notice: Subject to any disclaimer, the term of this patent is extended or adjusted under 35 U.S.C. 154(b) by 0 days.

(21) Appl. No.: 09/953,190

(22) Filed: Sep. 17, 2001

(65) Prior Publication Data

US 2002/0081434 A1 Jun. 27, 2002

(30) Foreign Application Priority Data

Sep. 18, 2000 (JP) .......................................... 2000-281806

(51) Int. Cl.⁷ ............................ B32B 27/38; B32B 7/12; C08L 63/00
(52) U.S. Cl. ..................... 428/418; 428/413; 428/414; 428/320.2; 428/355 N; 428/473.5; 156/330; 156/331.7; 525/452; 525/528; 525/540
(58) Field of Search ................................. 428/413, 414, 428/415, 416, 417, 418, 320.2, 355 N, 473.5; 156/330, 331.7; 525/452, 528, 540

(56) References Cited

U.S. PATENT DOCUMENTS 5,916,675 A * 6/1999 Komoto et al. .............. 156/289
6,103,836 A * 8/2000 Imashiro et al. ............. 525/452
6,143,409 A * 11/2000 Komoto et al. .............. 156/289
6,300,425 B1 * 10/2001 Amano et al. ............... 525/452

FOREIGN PATENT DOCUMENTS

| EP | 0 451 707 A2 | 10/1991 |
| EP | 0 610 960 A1 | 8/1994 |
| EP | 0 989 788 A2 | 3/2000 |

* cited by examiner

Primary Examiner—Robert Dawson
Assistant Examiner—Michael J Feely
(74) Attorney, Agent, or Firm—Kubovick & Kubovcik

(57) ABSTRACT

A thermosetting resin composition comprising:

a polycarbodiimide obtained from organic polyisocyanates containing at least one kind of aromatic polyisocyanate, an epoxy resin, a curing agent for epoxy resin, and a rubber component, wherein the proportions of the individual components are 100 parts by weight of the polycarbodiimide, 30 to 150 parts by weight of the epoxy resin, 1.0 equivalent or less, relative to the epoxy resin, of the curing agent for epoxy resin, and 0.1 to 20 parts by weight of the rubber component which is, in a semi-cured state (a B-stage), free from resin cracking or powder detaching when bent and therefore easy to handle and, after curing, has good electrical properties and heat resistance.

21 Claims, No Drawings

THERMOSETTING RESIN COMPOSITION, AND RESIN-COVERED METAL FOIL, PREPREG AND FILM-SHAPED ADHESIVE ALL USING THE COMPOSITION

BACKGROUND OF THE INVENTION (1) Field of the Invention

The present invention relates to a thermosetting resin composition, as well as to a resin coated metal foil, a prepreg and a film-shaped adhesive all using the above composition, suitably used particularly in electric and electronic fields.

(2) Description of the Prior Art

In printed wiring boards widely used in high-frequency devices, computers, etc. employed in electric or electronic appliances and communication, the wiring density is becoming finer and the signal processing speed is becoming higher. In connection therewith, the insulating resin constituting the laminate is strongly desired to have higher heat resistance and a lower dielectric constant. Meanwhile, the printed substrate used in the printed wiring board is ordinarily produced by impregnating an insulating resin into a base material such as a glass cloth (this sheet-like material is called a prepreg) and hot-pressing several sheets of the prepreg. Further, for production of a multilayer printed wiring board, a build-up process has been developed in recent years. In this build-up process, a resin coated metal foil (the metal foil is a copper foil in many cases) is used. The insulating resin used in such applications is required to have high heat resistance, a low dielectric constant, a low dielectric loss tangent, a high adhesion strength, a low water absorption, etc. in good balance.

As the insulating resins heretofore used in electric or electronic material fields, there are mentioned an epoxy resin, a polyimide resin, a phenolic resin, a BT (bismaleimide triazine) resin, etc. For example, a thermosetting resin composition comprising an epoxy resin, an amine type curing agent or an acid anhydride type curing agent and, as necessary, a curing accelerator has been used in production of a prepreg by impregnation into a base material such as a glass cloth and subsequent curing up to a B-stage, or in production of a resin coated metal foil having thereon a resin layer formed by the thermosetting resin composition, used for lamination on a circuit pattern-printed inner layer substrate for production of a multilayer printed wiring board (see, for example, JP-A-9-232763).

Epoxy resins have been used most generally from the standpoint such as overall balance of cost and properties. However, they are unable to respond to the higher requirements for resin properties, associated with the movement of electric or electronic appliances in recent years toward smaller size and higher wiring density; further, in producing therewith a prepreg, a resin coated metal foil, a film-shaped adhesive, etc., they have had, in the B-stage, operational problems such as remaining of resin tack, detaching of resin powder, resin cracking and the like. BT resins have had problems in, for example, high water absorption and inferior adhesivity to metals. Polyimide resins have had problems of, for example, requiring a high temperature during molding.

SUMMARY OF THE INVENTION

The present invention aims at alleviating the above-mentioned problems of the prior art and providing mainly a thermosetting resin composition which is, in a semi-cured state (a B-stage), free from resin cracking or resin powder detaching when bent and therefore easy to handle and, after curing, has good electrical properties and heat resistance.

The present inventors had made an intensive study in order to alleviate the problems possessed by conventional thermosetting resin compositions. As a result, the present inventors had developed a thermosetting resin composition composed mainly of a polycarbodiimide and an epoxy resin, having excellent heat resistance and adhesivity, and a patent application had been filed therefor. The present inventors made a further study in order to provide a thermosetting resin composition of higher properties useful particularly in electric and electronic fields. As a result, the present invention has been completed.

The present invention provides the following inventions to accomplish the above aims.

[1] A thermosetting resin composition comprising:
 a polycarbodiimide obtained from organic polyisocyanates containing at least one kind of aromatic polyisocyanate,
 an epoxy resin,
 a curing agent for epoxy resin, and
 a rubber component,
wherein the proportions of the individual components are 100 parts by weight of the polycarbodiimide, 30 to 150 parts by weight of the epoxy resin, 1.0 equivalent or less, relative to the epoxy resin, of the curing agent for epoxy resin, and 0.1 to 20 parts by weight of the rubber component.

[2] A resin coated metal foil which is a metal foil having thereon a resin layer formed by semi-curing a thermosetting resin composition set forth in the above [1].

[3] A prepreg obtained by impregnating a base material with a thermosetting resin composition set forth in the above [1].

[4] A film-shaped adhesive obtained by dissolving a thermosetting resin composition set forth in the above [1], in a solvent and casting the resulting solution.

[5] A film-shaped sealant obtained by dissolving a thermosetting resin composition set forth in the above [1], in a solvent and casting the resulting solution.

DETAILED DESCRIPTION OF THE INVENTION

The present invention is described in detail below.

As described above, the thermosetting resin composition of the present invention comprises:
 a polycarbodiimide obtained from organic polyisocyanates containing at least one kind of aromatic polyisocyanate,
 an epoxy resin,
 a curing agent for epoxy resin, and
 a rubber component.

As the polycarbodiimide used in the present invention, there can be mentioned those polycarbodiimides which can be produced, for example, by a process disclosed in JP-A-51-61599, a process by L. M. Alberin et al. [J. Appl. Polym. Sci., 21, 1999 (1977)], or a process disclosed in JP-A-2-292316, etc., that is, those polycarbodiimides which can be produced form an organic polyisocyanate in the presence of a catalyst capable of promoting the carbodiimidization of isocyanate. These polycarbodiimides can be used singly or in admixture.

As the organic polyisocyanate used as a raw material for synthesis of polycarbodiimide in each of the above processes, there can be mentioned, for example, aromatic polyisocyanates, aliphatic polyisocyanates, alicyclic polyisocyanates, and mixtures thereof. Specifically, there can be mentioned 2,4-tolylene diisocyanate, 2,6-tolylene diisocyanate, a mixture of 2,4-tolylene diisocyanate and 2,6-tolylene diisocyanate, crude tolylene diisocyanate, crude methylene diphenyl diisocyanate, 4,4',4"-triphenylmethylene triisocyanate, xylylene diisocyanate, m-phenylene diisocyanate, naphthylene-1,5-diisocyanate, 4,4'-biphenylene diisocyanate, 4,4'-diphenylmethane diisocyanate, 3,3'-dimethoxy-biphenyl diisocyanate, 3,3'-dimethyldiphenylmethane-4,4'diisocyanate, tetramethylxylylene diisocyanate, hexamethylene diisocyanate, isophorone diisocyanate, 4,4'-dicyclohexylmethane diisocyanate, etc., and mixtures thereof.

At least one kind of the organic polyisocyanates which are a raw material for synthesis of the polycarbodiimide used in the present invention, must be an aromatic polyisocyanate capable of giving a polycarbodiimide having a film-formability, because the thermosetting resin composition of the present invention obtained with the polycarbodiimide needs to be able to become a film after semi-curing or curing. As a particularly preferable example of such an aromatic polyisocyanate, 4,4'-diphenylmethane diisocyanate can be mentioned. Herein, "aromatic polyisocyanate" refers to an isocyanate having, in the molecule, at least two isocyanate groups directly bonding to the aromatic ring.

The aromatic polyisocyanate can be used in such an amount that the thermosetting resin composition of the present invention shows no tack in a semi-cured state (a B-stage). The aromatic polyisocyanate is preferably contained in the organic polyisocyanates used, specifically in an amount of, for example, 40% by weight or more.

Synthesis of the polycarbodiimide from the organic polyisocyanates can be conducted in a solvent-free state or in an appropriate solvent. The solvent can be exemplified by an alicyclic ether (e.g. tetrahydrofuran, 1,3-dioxane or dioxolan), an aromatic hydrocarbon (e.g. benzene, toluene, xylene or ethylbenzene), a halogenated hydrocarbon (e.g. chlorobenzene, dichlorobenzene, trichlorobenzene, Perclene, trichloroethane or dichloroethane) and cyclohexanone. These solvents can be used singly or in admixture thereof. Tetrahydrofuran is particularly preferred.

The reaction temperature employed in the synthesis of the polycarbodiimide is not particularly restricted but is preferred to be, for example, 40° C. to the boiling point of the solvent used. The concentration of the organic polyisocyanates used as a raw material in the synthesis of the polycarbodiimide is 5 to 50% by weight, preferably 5 to 20% by weight. When the concentration of the organic polyisocyanates is less than 5% by weight, a long time is taken for synthesis of the polycarbodiimide, which is not economical. When the concentration is more than 50% by weight, the reaction system may cause gelation during synthesis. Therefore, none of such concentrations is preferred.

Synthesis of the polycarbodiimide from the organic polyisocyanates is conducted in the presence of a catalyst capable of promoting the carbodiimidization of isocyanate. As such a carbodiimidization catalyst, there can be mentioned, for example, phosphorus-containing compounds such as 1-phenyl-2-phospholene-1-oxide, 3-methyl-1-phenyl-2-phospholene-1-oxide, 1-ethyl-2-phospholene-1-oxide, 1-methyl-2-phospholene-1-oxide and the like. 3-Methyl-1-phenyl-2-phospholene-1-oxide is particularly preferred.

The polymerization degree of the polycarbodiimide used in the present invention is preferably 3,000 to 50,000, more preferably 10,000 to 30,000, most preferably 15,000 to 25,000 in terms of number-average molecular weight (a polystyrene-reduced value as measured by GPC). When the number-average molecular weight is less than 3,000, it is impossible to obtain a sufficient film-formability and a resin heat resistance and toughness after curing. When the number-average molecular weight is more than 50,000, a long time is taken for synthesis of a varnish (which is not economical), and the varnish has an extremely short pot life (short usable time) and poor handleability. Therefore, none of such number-average molecular weights is preferred.

As the polycarbodiimide used in the present invention, there can also be used, as necessary, a polycarbodiimide whose polymerization degree has been controlled to an appropriate level by using, as a terminal-blocking agent, a compound (e.g. a monoisocyanate) capable of reacting with the terminal isocyanate of carbodiimide compound. Such a monoisocyanate can be exemplified by phenyl isocyanate, o-, m-, or p-tolyl isocyanate, dimethylphenyl isocyanate, cyclohexyl isocyanate and methyl isocyanate.

As the compound capable of reacting with the terminal isocyanate of carbodiimide compound, usable as a terminal-blocking agent, there can also be mentioned, besides the monoisocyanate, aliphatic, aromatic or alicyclic compounds having —OH group (e.g. methanol, ethanol, phenol, cyclohexanol, N-methylethanolamine, polyethylene glycol monomethyl ether and polypropylene glycol monomethyl ether), —NH$_2$ group (e.g. butylamine and cyclohexylamine), —COOH group (e.g. propionic acid, benzoic acid and cyclohexanecarboxylic acid), —SH group (e.g. ethylmercaptan, allylmercaptan and thiophenol), —NH-alkyl terminal, or the like.

As the epoxy resin used in the present invention, there can be mentioned, for example, epoxy resins having at least one epoxy group in the molecule, such as glycidyl ether type epoxy resin (e.g. bisphenol A type epoxy resin, bisphenol F type epoxy resin, novolac type epoxy resin, cresol novolac type epoxy resin, naphthalene type epoxy resin or dicyclopentadiene type epoxy resin), alicyclic epoxy resin, glycidyl ester type epoxy resin, glycidylamine type epoxy resin, heterocyclic epoxy resin, rubber-modified epoxy resin, rubber-dispersed epoxy resin and the like. These epoxy resins can be used singly or in admixture thereof. The epoxy resin used in used in the present invention is not restricted thereto, and a generally known epoxy resin can be used.

As the curing agent for epoxy resin used in the present invention, there can be mentioned those generally known as a curing agent for epoxy resin. As such curing agents, there can be mentioned, for example, polyamines such as dicyandiamide, diaminodiphenylsulfone, phenylene diamine, melamine and derivatives thereof; dihydrazides (e.g. naphthalene dihydrazide); imidazole and derivatives thereof and the like; acid anhydrides such as phthalic anhydride, tetrahydrophthalic anhydride, methylnadic anhydride, pyromellitic anhydride and the like; and polyphenols such as phenolic novolac resin and the like.

The curing agent for epoxy resin can be used as an admixture of two or more kinds of the above curing agents. The curing agent preferably has a melting point of 50° C. or higher from the standpoint to prevent a shortening of the pot life of the thermosetting resin composition of the present invention, and particularly preferred examples are melamine and derivatives thereof.

As the rubber component used in the present invention, there can be mentioned, for example, liquid rubbers such as acrylic rubber, nitrile rubber (polyacrylonitrile-butadiene copolymer), polybutadiene rubber, polyisoprene rubber and the like. These rubbers can be used singly or in admixture.

Among them, preferred are an acrylic rubber and a nitrile rubber, and particularly preferred are a liquid acrylic rubber and a liquid nitrile rubber both having carboxyl group terminals. The rubber component used in the present invention may be a rubber present in the rubber-dispersed (or rubber-modified) epoxy resin mentioned previously as an example of the epoxy resin used in the present invention.

The proportions of the above-mentioned components in the thermosetting resin composition of the present invention are as follows.

Polycarbodiimide: 100 parts by weight

Epoxy resin: preferably 30 to 150 parts by weight, more preferably 50 to 100 parts by weight, particularly preferably 60 to 80 parts by weight Rubber component: preferably 0.1 to 20 parts by weight, more preferably 1 to 15 parts by weight, particularly preferably 3 to 10 parts by weight When the proportion of the epoxy resin is less than 30 parts by weight relative to 100 parts by weight of the polycarbodiimide, the resulting thermosetting resin composition has low adhesivity. When the proportion is more than 150 parts by weight, the resulting thermosetting resin composition has inferior film-formability and shows tack in a semi-cured state. When the proportion of the rubber component is less than 0.1 parts by weight relative to 100 parts by weight of the polycarbodiimide, the resulting thermosetting resin composition is low in resistance to soldering heat after water absorption. When the proportion is more than 20 parts by weight, the resulting thermosetting resin composition is inferior in heat resistance after curing. Incidentally, the rubber component includes not only the above-mentioned acrylic rubber and nitrile rubber but also a rubber in rubber-dispersed (or rubber-modified) epoxy resin.

The proportion of the curing agent for epoxy resin in the thermosetting resin composition of the present invention is preferably 1.0 equivalent or less, more preferably 0.5 equivalent or less relative to the epoxy resin. When the proportion of the curing agent for epoxy resin is more than 1.0 equivalent, the resulting thermosetting resin composition is inferior in heat resistance and other resin properties.

The thermosetting resin composition of the present invention, for example, a resin varnish can be produced by directly mixing the individual components of the resin varnish, i.e. a polycarbodiimide, an epoxy resin, a curing agent for epoxy resin and a rubber component, or by dissolving the individual components in an appropriate solvent and stirring the resulting mixture. There is no particular restriction as to the stirring method or the addition order of the components. For example, a curing agent and a rubber component can be dispersed in an epoxy resin using a roll mill and the resulting dispersion can be mixed with a polycarbodiimide using a mixer or the like.

As the solvent used in producing the resin varnish, there is preferred a solvent capable of dissolving both the polycarbodiimide and the epoxy resin. Particularly preferred are tetrahydrofuran, toluene and tetrachloroethylene.

The thermosetting resin composition constituted as above, of the present invention has various applications particularly in electric and electronic fields.

First, a resin coated metal foil can be produced from a varnish of the present thermosetting resin composition by coating the varnish on a metal foil by a known method using a comma coater, a knife coater, a curtain coater or the like and then vaporizing the solvent in the varnish or drying the coated varnish to semi-cure the present thermosetting resin composition and form a resin layer on the metal foil.

As the metal foil used in the resin coated metal foil, a copper foil is preferred and, in particular, an electrolytic copper foil is most preferred. The temperature of the drying applied after the varnish of the present thermosetting resin composition has been coated on the metal foil, is appropriately determined by the boiling point of the solvent used, but it is 30 to 150° C. The drying is conducted until no tack is seen on the surface of the resin layer formed. The thickness of the resin layer formed is 10 to 150 $\mu$m, preferably 20 to 100 $\mu$m. The resin coated metal foil thus produced is suitably used in production of a printed substrate (particularly in a build-up process).

Further, a prepreg can be produced by impregnating a varnish of the present thermosetting resin composition into a base material. As the base material, there can be used, for example, a glass cloth, a carbon fiber or an organic fiber such as an aramide fiber or the like. The temperature of the drying conducted after varnish impregnation is appropriately determined by the boiling point of the solvent used; however, a very high temperature is not preferred and the drying temperature is preferably such a temperature that the amount of the solvent remaining in the prepreg becomes 1% by weight or less. The thus-obtained prepreg is suitably used in production of a printed substrate (as a raw material for laminate).

Furthermore, a film-shaped adhesive or sealant which may contain a base material, can be produced from a varnish of the present thermosetting resin composition by coating the varnish on a base material by a known method using a comma coater, a knife coater, a curtain coater or the like, then vaporizing the solvent in the varnish or drying the coated varnish to semi-cure the present thermosetting resin composition and form a resin layer on the base material, and, as necessary, peeling the resin layer from the base material.

As the base material used in production of the film-shaped adhesive or sealant, a PET film, a propylene film, a fluororesin-based film or the like all subjected to a release treatment is preferred when the base material is to be peeled. There is no particular restriction as to the kind of the base material when the base material is not to be peeled. The temperature of the drying conducted after a varnish of the present thermosetting resin composition has been coated on a base material, is appropriately determined by the boiling point of the solvent used, but it is 30 to 150° C. The drying is conducted until no tack is seen on the surface of the resin layer formed. The thickness of the resin layer formed is 5 to 400 $\mu$m, preferably 10 to 100 $\mu$m. The thus-obtained film-shaped adhesive or sealant is suitably used for production of a printed substrate (an insulating resin layer) or for adhesion of electronic parts or sealing, protection, etc. of components.

The thermosetting resin composition of the present invention contains, as a component, a polycarbodiimide obtained from organic polyisocyanates containing at least one kind of aromatic polyisocyanate, and the aromatic polycarbodiimide has good film-formability. Therefore, the present thermosetting resin composition causes neither resin cracking nor resin powder detaching when bent in a semi-cured state (a B-stage) and has good handleability.

The present thermosetting resin composition is also superior in heat resistance after curing, owing to (1) the heat resistance of the polycarbodiimide itself which is obtained from organic polyisocyanates containing at least one kind of aromatic polyisocyanate and (2) the heat resistance possessed by a heterocyclic five-membered ring (imidazolidinone) formed by a reaction between the carbodiimide and the epoxy resin.

In the thermosetting resin composition of the present invention, no hydroxyl group is formed in the self-crosslinking reaction of the carbodiimide or the imidazolidinone-forming reaction and, therefore, formation of hydroxyl group during curing is suppressed; as a result, it is possible to obtain a cured resin superior in dielectric properties, i.e. low dielectric constant and low dielectric loss tangent.

By using a curing agent for epoxy resin, in the present thermosetting resin composition, it is possible to obtain a high peeling strength, especially toward a metal foil, in particular a copper foil, when a resin coated metal foil is produced. By further using a rubber component, a resin composition of higher toughness can be obtained.

Thus, the present thermosetting resin composition comprising given amounts of a polycarbodiimide, an epoxy resin, a curing agent for epoxy resin and a rubber component is superior in dielectric properties, heat resistance, resistance to soldering heat, adhesivity, etc. and further in resistance to soldering heat after water absorption.

The present invention is described in detail below by way of Production Examples, Examples and Comparative Examples.

Production Example 1 (Synthesis of Polycarbodiimide)

Into a reactor equipped with a stirrer and a condenser were fed 172 g of 4,4'-diphenylmethane diisocyanate (hereinafter referred to as MDI), 1.64 g of phenyl isocyanate (hereinafter referred to as PI), 1.29 kg of tetrahydrofuran (a solvent [hereinafter referred to as THF]) and 0.344 g of 3-methyl-1-phenyl-2-phospholene-1-oxide (a catalyst). The reactor contents were subjected to a reaction for 16 hours under refluxing, whereby was obtained a varnish of a polycarbodiimide having a number-average molecular weight (polystyrene-reduced) of $2.0 \times 10^4$ as measured by gel permeation chromatography (hereinafter referred to as GPC). This varnish is called as "varnish 1".

Production Example 2 (Synthesis of Polycarbodiimide)

Into a reactor equipped with a stirrer and a condenser were fed 344 g of MDI, 1.64 g of PI, 3,600 g of THF (a solvent) and 0.688 g of 3-methyl-1-phenyl-2-phospholene-1-oxide (a catalyst). The reactor contents were subjected to a reaction for 18 hours under refluxing, whereby was obtained a varnish of a polycarbodiimide having a number-average molecular weight (polystyrene-reduced) of $3.5 \times 10^4$ as measured by GPC. This varnish is called as "varnish 2".

Production Example 3 (Synthesis of Polycarbodiimide)

Into a reactor equipped with a stirrer and a condenser were fed 86 g of MDI, 1.64 g of PI, 390 g of THF (a solvent) and 0.37 g of 3-methyl-1-phenyl-2-phospholene-1-oxide (a catalyst). The reactor contents were subjected to a reaction for 7 hours under refluxing, whereby was obtained a varnish of a polycarbodiimide having a number-average molecular weight (polystyrene-reduced) of $6.0 \times 10^3$ as measured by GPC. This varnish is called as "varnish 3".

Production Example 4 (Synthesis of Polycarbodiimide)

Into a reactor equipped with a stirrer and a condenser were fed 210 g of tolylene diisocyanate, 2.87 g of PI, 1.43 kg of tetrachloroethylene (a solvent) and 0.42 g of 3-methyl-1-phenyl-2-phospholene-1-oxide (a catalyst). The reactor contents were subjected to a reaction for 4 hours under refluxing, whereby was obtained a varnish of a polycarbodiimide having a number-average molecular weight (polystyrene-reduced) reduced) of $1.0 \times 10^4$ as measured by GPC. This varnish is called as "varnish 4".

EXAMPLES 1 to 5

Comparative Examples 1 to 5

One or two kinds of the polycarbodiimide varnishes (varnishes 1 to 4) obtained in the above Production Examples 1 to 4, one or two kinds of epoxy resins, a curing agent for epoxy resin and a rubber component were compounded in the proportions shown in Table 1, to prepare thermosetting resin composition varnishes. The varnishes were measured for properties according to the methods described later.

TABLE 1

|  | Examples | | | | | Comparative Examples | | | | |
|---|---|---|---|---|---|---|---|---|---|---|
|  | 1 | 2 | 3 | 4 | 5 | 1 | 2 | 3 | 4 | 5 |
| Polycarbodi-imide varnish | | | | | | | | | | |
| 1*[1] | 100 | | | | 50 | 100 | 100 | | | 100 |
| 2*[1] | | 100 | | | | | | 100 | | |
| 3*[1] | | | 100 | | | | | | | |
| 4*[1] | | | | 100 | 50 | | | | | |
| Epoxy resin | | | | | | | | | | |
| Epicoat 828 | 50 | 70 | 45 | 30 | 30 | 50 | 200 | | 100 | 50 |
| YDCN 703 | | 30 | 25 | | | | | | | |
| Curing agent for epoxy resin | | | | | | | | | | |
| Melamine | 0.1*[2] | | | 0.1*[2] | 0.1*[2] | | 0.1*[2] | | 0.1*[2] | 0.1*[2] |
| ZLW-2A | | 0.5*[2] | | | | | | | | |
| NDH | | | 0.8*[2] | | | | | | | |
| Rubber | | | | | | | | | | |

TABLE 1-continued

|  | Examples | | | | | Comparative Examples | | | | |
| --- | --- | --- | --- | --- | --- | --- | --- | --- | --- | --- |
|  | 1 | 2 | 3 | 4 | 5 | 1 | 2 | 3 | 4 | 5 |
| component |  |  |  |  |  |  |  |  |  |  |
| YR-628 | 20 (3.5) |  | 30 (5) |  | 30 (5) | 20 (3.5) |  |  |  |  |
| CTBN |  | 10 |  | 15 |  |  |  |  | 5 | 10 |

*[1]refer to No. of Production Example.
Unit of each figure: parts by weight except that *[2]refers to equivalent relative to epoxy resin.
Vacant column indicates "0".
Figure in ( ): refers to parts by weight of pure rubber in YR-628.
Epicoat 828: a bisphenol A type epoxy resin produced by Yuka Shell Epoxy Co., Ltd.
YDCN 703: a cresol novolac type epoxy resin produced by Tohto Kasei Co., Ltd.
ZLW-2A: an amine type curing agent, produced by Shikoku Chemicals Corporation
NDH: naphthalene dihydrazide produced by Japan Hydrazine Co., Inc.
YR-628: a rubber-dispersed epoxy resin produced by Tohto Kasei Co., Ltd.
CTBN: a liquid rubber, HYCAR (registered trademark)

[Test Methods]

1. Handleability in Semi-cured State

One of the resin varnishes obtained in Examples 1 to 5 and Comparative Examples 1 to 5 was coated, by casting, on the matte surface of an electrolytic copper foil (YGP-18 produced by Nippon Denkai Co., Ltd.) so that the thickness of the resin after drying became 60 to 70 μm. The coated resin varnish was dried at 50° C. for 10 minutes and further at 80° C. for 10 minutes to obtain a resin-covered copper foil. The resin-covered copper foil was bent by 180° and visually checked for cracking and peeling of resin. In Comparative Example 4, however, 30 parts by weight of dimethylformamide was added to 100 parts by weight of an epoxy resin to prepare a resin varnish; and the resin varnish was dried at 170° C. for 10 minutes to obtain a resin-covered copper foil.

2. Storage Stability

One of the resin varnishes obtained in Examples 1 to 5 and Comparative Examples 1 to 5 was impregnated into a glass cloth having a thickness of 0.1 mm, followed by drying, to obtain a prepreg having a thickness of 0.12 mm. The prepreg was measured for storage stability by storing the prepreg for 7 days in an atmosphere of 40° C. (temp.)× 80% (humidity), preparing therefrom a laminated sheet under the following molding conditions, and examining the condition of the laminated sheet.

First, three of the above-obtained prepregs were laminated; a copper foil of 18 μm in thickness was placed on the upper and lower surfaces of the laminated prepreg; the resuiting material was subjected to hot pressing at a surface pressure of 2 MPa at 180° C. for 1 hour. Then, the copper foil was removed by etching and the appearance of the laminated prepreg was examined visually. When the life of prepreg is over, voids remain; therefore, the storage stability of prepreg could be easily measured by examining the appearance of the laminated prepreg.

3. Dielectric Constant and Dielectric Loss Tangent

One of the resin varnishes obtained in Examples 1 to 5 and Comparative Examples 1 to 5 was cast on a PET film subjected to a release treatment; the solvent in the coated varnish was vaporized; and the resulting resin composition film was peeled from the PET film. The peeled film was cut into a predetermined size and cured at 180° C. for 1 hour to produce a sample for measurement of dielectric constant or dielectric loss tangent. The sample was measured for dielectric constant or dielectric loss tangent at 20 kHz according to JIS K 6911 using HP-4284A Type LCR Meter (a product of Hewlett-Packard Co.).

4. Glass Transition Temperature

The same resin composition film as obtained in the above 3. was cut into a size of 30 mm×5 mm and cured at 180° C. for 1 hour to produce a sample for measurement of glass transition temperature. The sample was measured for glass transition temperature at a temperature elevation rate of 5° C. per minute at a frequency of 10 Hz using Rheolograph Solid produced by TOYO SEIKI SEISAKU-SHO, LTD. A peak top temperature of tan δ was taken as the glass transition temperature (Tg).

5. Peeling Strength

Peeling strength was measured as follows. A commercial copper-clad laminated sheet was degreased at the surface. On the degreased laminated sheet was placed the same resin-covered copper foil as produced in the above 1. so that the copper side of the laminated sheet and the resin side of the copper foil faced each other. The resulting material was subjected to hot pressing at a surface pressure of 2 MPa at 180° C. for 1 hour to produce a sample for measurement of peeling strength. The sample was measured for peeling strength according to JIS C 6481. Five tests were conducted for each of five samples.

6. Resistance to Soldering Heat

A square (2.5 cm×2.5 cm) copper-clad laminated sheet was degreased at the surface. On the degreased laminated sheet was placed the same resin-covered copper foil as produced in the above 1. so that the copper side of the laminated sheet and the resin side of the copper foil faced each other. The resulting material was subjected to hot pressing at a surface pressure of 2 MPa at 180° C. for 1 hour to produce a sample for measurement of resistance to soldering heat. The sample was measured for resistance to soldering heat according to JIS C 6481 by floating it on a solder bath of 260° C. for 120 seconds and examining the appearance (occurrence of peeling and swelling) of the resulting sample. Ten tests were conducted for each of ten samples. Resistance to soldering heat after water absorption was measured according to JIS C 6481 by removing, by etching, half of one side (the electrolytic copper foil side) of the above-produced sample for measurement of resistance to soldering heat, immersing the partially etched sample in hot water of 100° C. for 1 hour, then floating the sample on a solder bath of 260° C. for 120 seconds, and examining the appearance (occurrence of peeling and swelling) of the resulting sample. Ten tests were conducted for each of ten samples.

7. Adhesion Strength

The same resin composition film as obtained in the above 3. was cut into a size of 25 mm×12.5 mm, and the cut sample was nipped between two copper plates each of 2 mm in thickness and a test sample was produced according to JIS K 6850. (The conditions for sample production were 180° C., 1 hour and pressure of 1 MPa.) The sample was measured for adhesion strength using a tensile tester produced by Instron Co., Ltd.

8. Processability

A resin composition film of 15 cm×15 cm obtained in the same manner as in the above 3. was laid on a mold. Thereon were placed 10 metal bars of about 1 mm in diameter, in parallel. Thereon was placed the same film (15 cm×15 cm) as used above, in such a way that the whole metal bars were hidden. The resulting material was molded at 40 kg/cm$^2$ at 180° C. for 5 minutes; then, post-curing was conducted at 200° C. for 30 minutes to complete a curing reaction. Thereafter, the cured material was cut in a direction normal to the metal bars and measured for (number of completely adhered metal bars)/(number of total metal bars used=10).

The results are shown in Table 2.

TABLE 2

|  | Examples | | | | | Comparative Examples | | | | |
| --- | --- | --- | --- | --- | --- | --- | --- | --- | --- | --- |
|  | 1 | 2 | 3 | 4 | 5 | 1 | 2 | 3 | 4 | 5 |
| Handleability in semi-cured state[a] | ○ | ○ | ○ | ○ | ○ | ○ | X | ○ | X | ○ |
| Storage stability | Good | Good | Good | Good | Good | Good | Good | Bad | Bad | Good |
| Dielctric constant | 3.2 | 3.3 | 3.1 | 3.4 | 3.0 | 3.3 | 3.8 | 3.4 | 3.9 | 3.4 |
| Dielectric loss tangent | 0.007 | 0.008 | 0.007 | 0.008 | 0.009 | 0.008 | 0.016 | 0.003 | 0.042 | 0.008 |
| Tg (° C.) | 200 | 210 | 190 | 195 | 210 | 200 | 160 | 215 | 150 | 190 |
| Peeling strength (kN/m) | 1.3 | 1.4 | 1.2 | 1.3 | 1.3 | 0.5 | 0.7 | 0.2 | 0.2 | 1.0 |
| Resistance to soldering heat[b] | 10/10 | 10/10 | 10/10 | 10/10 | 10/10 | 6/10 | 8/10 | 2/10 | 9/10 | 6/10 |
| Resistance to soldering heat after water absorption[b] | 10/10 | 10/10 | 10/10 | 10/10 | 10/10 | 1/10 | 4/10 | 0/10 | 7/10 | 3/10 |
| Adhesion strength (MPa) | 20 | 18 | 23 | 17 | 26 | 10 | 15 | 6 | c) | 19 |
| Processability | 10/10 | 10/10 | 10/10 | 10/10 | 10/10 | 10/10 | 7/10 | 1/10 | d) | 10/10 |

[a]○: There is neither cracking nor peeling of resin when bent by 180°.
X: There are cracking and peeling of resin when bent by 180°.
[b](Number of samples free from peeling or swelling)/(number of total samples)
c) Production of resin film was impossible.
d) Production of resin film was impossible.

As is clear from the results of Table 2, the resin varnishes of the Examples are superior in handleability in a semi-cured state, as well as in dielectric properties, peeling strength and resistance to soldering heat after curing. In contrast, in the resin varnishes of the Comparative Examples, the absence of polycarbodiimide gives inferior handleability in semi-cured state and inferior dielectric properties (Comparative Example 4); the absence of curing agent (and rubber component in Comparative Example 1) gives inferior peeling strength and inferior resistance to soldering heat (Comparative Examples 1 and 3); the absence of rubber component gives inferior resistance to soldering heat (Comparative Example 5).

Thus, the thermosetting resin composition of the present invention is high in heat resistance and peeling strength after curing, is superior in dielectric properties and resistance to soldering heat, and can be suitably used in production of laminated sheet or printed board. By using the present thermosetting resin composition, the resin coated metal foil, prepreg and film-shaped adhesive, each superior in handleability and storage stability while the resin is in a semi-cured state can be obtained. Accordingly, the present thermosetting resin composition, as compared with resins heretofore used in production of printed board, can give improved productivity and has a high industrial value.

The film obtained from the present thermosetting resin composition is superior also in processability and therefore provides an excellent film-shaped sealant used for sealing or protecting an electronic component, etc.

What is claimed is:

1. A thermosetting resin composition comprising:
    a polycarbodiimide obtained from organic polyisocyanates containing at least one kind of aromatic polyisocyanate,
    an epoxy resin,
    a curing agent for epoxy resin, and
    a rubber component,
    wherein the proportions of the individual components are 100 parts by weight of the polycarbodiimide, 30 to 150 parts by weight of the epoxy resin, 1.0 equivalent or less, relative to the epoxy resin, of the curing agent for epoxy resin, and 0.1 to 20 parts by weight of the rubber component.

2. A thermosetting resin composition according to claim 1, wherein the polycarbodiimide has a number-average molecular weight of 3,000 to 50,000.

3. A resin coated metal foil which is a metal foil having thereon a resin layer formed by semi-curing a thermosetting resin composition set forth in claim 2.

4. A prepreg obtained by impregnating a base material with a thermosetting resin composition set forth in claim 2.

5. A film-shaped adhesive obtained by dissolving a thermosetting resin composition set forth in claim 2, in a solvent and casting the resulting solution.

6. A film-shaped sealant obtained by dissolving a thermosetting resin composition set forth in claim 2, in a solvent and casting the resulting solution.

7. A thermosetting resin composition according to claim 2, wherein the curing agent for epoxy resin has a melting point of 50° C. or more.

8. A resin coated metal foil which is a metal foil having thereon a resin layer formed by semi-curing a thermosetting resin composition set forth in claim 7.

9. A prepreg obtained by impregnating a base material with a thermosetting resin composition set forth in claim 7.

10. A film-shaped adhesive obtained by dissolving a thermosetting resin composition set forth in claim 7, in a solvent and casting the resulting solution.

11. A film-shaped sealant obtained by dissolving a thermosetting resin composition set forth in claim 7, in a solvent and casting the resulting solution.

12. A thermosetting resin composition according to claim 1, wherein the curing agent for epoxy resin has a melting point of 50° C. or more.

13. A resin coated metal foil which is a metal foil having thereon a resin layer formed by semi-curing a thermosetting resin composition set forth in claim 12.

14. A prepreg obtained by impregnating a base material with a thermosetting resin composition set forth in claim 12.

15. A film-shaped adhesive obtained by dissolving a thermosetting resin composition set forth in claim 12, in a solvent and casting the resulting solution.

16. A film-shaped sealant obtained by dissolving a thermosetting resin composition set forth in claim 12, in a solvent and casting the resulting solution.

17. A resin coated metal foil which is a metal foil having thereon a resin layer formed by semi-curing a thermosetting resin composition set forth in claim 1.

18. A resin coated metal foil according to claim 17, wherein the metal foil is a copper foil.

19. A prepreg obtained by impregnating a base material with a thermosetting resin composition set forth in claim 1.

20. A film-shaped adhesive obtained by dissolving a thermosetting resin composition set forth in claim 1, in a solvent and casting the resulting solution.

21. A film-shaped sealant obtained by dissolving a thermosetting resin composition set forth in claim 1, in a solvent and casting the resulting solution.

* * * * *